（12）United States Patent
Cake et al.

(10) Patent No.: US 7,663,624 B2
(45) Date of Patent: Feb. 16, 2010

(54) REPORT GENERATING METHOD AND APPARATUS

(75) Inventors: Anthony Cake, Givrins (CH); Yann Oeffner, Founex (CH); Lawrence Salant, New Hempstead, NY (US)

(73) Assignee: LeCroy Corporation, Chestnut Ridge, NY (US)

( * ) Notice: Subject to any disclaimer, the term of this patent is extended or adjusted under 35 U.S.C. 154(b) by 307 days.

(21) Appl. No.: 11/157,455

(22) Filed: Jun. 21, 2005

(65) Prior Publication Data

US 2006/0001666 A1    Jan. 5, 2006

Related U.S. Application Data

(60) Provisional application No. 60/584,065, filed on Jun. 30, 2004, provisional application No. 60/616,558, filed on Oct. 6, 2004.

(51) Int. Cl.
*G06T 11/20* (2006.01)
(52) U.S. Cl. .......................... 345/440; 702/57
(58) Field of Classification Search ................ 345/440; 702/57
See application file for complete search history.

(56) References Cited

U.S. PATENT DOCUMENTS

| | | | | |
|---|---|---|---|---|
| 4,821,030 A * | 4/1989 | Batson et al. | ............... | 345/173 |
| 4,884,228 A * | 11/1989 | Stanley et al. | ............... | 702/123 |
| 5,301,336 A * | 4/1994 | Kodosky et al. | ............ | 715/846 |
| 5,480,804 A * | 1/1996 | Niwa et al. | .............. | 435/286.1 |
| 5,519,820 A * | 5/1996 | Kawauchi et al. | ........... | 345/440 |
| 5,689,717 A * | 11/1997 | Pritt | ............................ | 715/234 |
| 5,705,891 A * | 1/1998 | Ishida et al. | .................... | 315/1 |
| 5,714,878 A * | 2/1998 | Saito et al. | ............. | 324/121 R |
| 6,054,984 A * | 4/2000 | Alexander | ................... | 715/771 |
| 6,104,968 A * | 8/2000 | Ananth | ....................... | 700/297 |
| 6,151,010 A * | 11/2000 | Miller et al. | ............. | 345/440.1 |
| 6,224,549 B1* | 5/2001 | Drongelen | .................. | 600/300 |
| 6,229,536 B1* | 5/2001 | Alexander et al. | ........ | 345/440.1 |
| 6,320,577 B1* | 11/2001 | Alexander | ............... | 345/440.1 |
| 6,374,189 B1* | 4/2002 | Sasai | ........................... | 702/75 |
| 6,526,361 B1* | 2/2003 | Jones et al. | ................... | 702/63 |
| 6,567,760 B1* | 5/2003 | Kikuchi et al. | ................ | 702/67 |

(Continued)

OTHER PUBLICATIONS

Health research computing: A semi-automated physiological data acquisition system for human studies of atmospheric pollutant effects Ralph W. Stacy, Sam Bryan, Robin Davis, George S. Malindzak Mar. 1981 ACM SIGBIO Newsletter, vol. 5 Issue SI Publisher: ACM Press.*

(Continued)

*Primary Examiner*—Javid A Amini
(74) *Attorney, Agent, or Firm*—Gordon Kessler

(57) ABSTRACT

A method, apparatus and computer program having instructions for storing information in an oscilloscope is provided. The method comprises the steps of storing a screen display in a predetermined format, storing one or more configuration settings associated with the screen display, and storing in memory channel acquisition data associated with the stored screen display. The screen display may also be annotated, the annotation information being stored as well. The stored screen display, one or more associated configuration settings, and stored channel acquisition data, and annotation data, if applicable, may be loaded into the oscilloscope, thereby placing the oscilloscope in the state it was in when the stored data was originally generated.

29 Claims, 8 Drawing Sheets

U.S. PATENT DOCUMENTS

| | | | |
|---|---|---|---|
| 6,571,185 B1 * | 5/2003 | Gauland et al. | 702/68 |
| 6,801,488 B2 * | 10/2004 | Kato et al. | 369/47.28 |
| 6,885,953 B2 * | 4/2005 | Farkas et al. | 702/68 |
| 6,965,383 B2 * | 11/2005 | Ritter et al. | 345/606 |
| 7,043,378 B2 * | 5/2006 | Peters | 702/57 |
| 2002/0030683 A1 * | 3/2002 | Alexander | 345/440.1 |
| 2002/0114249 A1 * | 8/2002 | Kato et al. | 369/59.17 |
| 2003/0112241 A1 * | 6/2003 | Fernando | 345/440 |
| 2004/0122605 A1 * | 6/2004 | Miyazaki | 702/57 |
| 2004/0230386 A1 * | 11/2004 | Peters | 702/57 |
| 2005/0159906 A1 * | 7/2005 | Tada | 702/57 |

OTHER PUBLICATIONS

A PC-controlled data acquisition system for transabdominal recording of cardiac activity in the human fetus Donna M. Mooney, Lynn J. Groome, J. Doug Wilson, Dennis L. Stearns, Lynn S. Bentz Mar. 1993 Proceedings of the 1993 ACM.*

LeCroy Corporation, LeCroy LS-140 Operator's Manual, Aug. 1994, , Rev. B, pp. 23 through 33, particularly pp. 24 and 29, USA.

* cited by examiner

X-Stream DSO Report

WM000001

User: Larry.Salant

6/28/2004
11:54:06 AM
Record Id:
00003 channels 1 and 2

Description:
shows channel 1 and 2 with parameter measurements

- Channel Status:

|  |  | C1 | C2 |
|---|---|---|---|
| Vertical | *V / Div* | --- | 50.0 mV |
|  | *Offset* | 0.0 mV | 0.0 mV |
|  | *Coupling* | DC50O | DC50O |
|  | *BW-Limit* | Full | Full |
|  | *Probe* | --- | --- |
| Horizontal | *Scale / Div* | 50.0 ns | 50.0 ns |
|  | *Delay* | 0 ns | 0 ns |
|  | *Scale / Pt* | 100 ps | 100 ps |
|  | *Pts / Div* | 500 S | 500 S |
| Sweeps |  | --- | --- |
| Status |  | Valid. | Valid. |

- Acquisition status:

Horizontal

| | | | | |
|---|---|---|---|---|
| *Time / Div* | 50.0 ns | *Sampling rate* | 10 GS/s *Segments* | 10 |
| *Time / Pt* | 100 ps | *Sampling mode* | RealTime | |
| *Pts / Div* | 500.0 S | *Trigger delay* | 0 ns | |

Trigger

| | | | |
|---|---|---|---|
| *Mode* | Auto | *Slope* | Positive |
| *Type* | Edge | *Level* | 0.0 mV |
| *Source* | C1 | *Coupling* | DC |

Figure 3

REPORT GENERATING METHOD AND APPARATUS

CROSS REFERENCE TO RELATED APPLICATIONS

This application claims the benefit of U.S. Provisional Patent Application Ser. No. 60/616,558, filed Oct. 6, 2004, and U.S. Provisional Patent Application Ser. No. 60/584,065, filed Jun. 30, 2004, the contents of each being incorporated herein by reference.

BACKGROUND OF THE INVENTION

Since the first CRT-based oscilloscope (as well as other real-time test and measurement equipment) was invented users have been generating and annotating hardcopies of screen images as part of a reporting feature. Often a user not only wanted to memorialize a displayed waveform, but also wanted to make various notes to point out portions of the waveform, or to record other information with the waveform, perhaps for a laboratory notebook or the like. In the early days of true analog oscilloscopes, an instant camera (e.g. Polaroid Instamatic) was commonly used to merely take a picture of the oscilloscope display. The images produced by these cameras would then typically be glued into a lab-notebook, along with annotation, both around, and sometimes on the image. While this allowed for a user to have a record of the waveform and various notes related thereto, this tedious method has many obvious drawbacks. First, the image clarity is dependent on the camera used. Additionally, the need to paste the image, and then write on and around the image in undesirable, perhaps producing noted that are imprecise or difficult to read. Furthermore, it was difficult to share the recorded information with others. Finally, if an error was made, or a change to the annotation was desired, a new picture had to be taken. If the waveform was one that could not easily be reproduced, taking another picture may have been impossible.

With the advent of Digital Storage Oscilloscopes (DSOs) the Polaroid camera was generally discarded in favor of electronic means of image capture. Early DSOs were equipped with GPIB or RS232 ports. Data could be output via these ports to a host computer, which would in turn capture an image of the display. Some later oscilloscope models included built-in Mass-Storage devices, including the Floppy Drive, hard drives, and more recently USB-based 'flash drives'. The later could then be used via 'Sneaker-Net' to transfer the screen image to another electronic device by physically moving the USB drive.

In each of these situations, once the image information was captured on the oscilloscope, a common workflow involved transferring the image into a host computer for storage and display using one of the above methods, and then loading the image into a picture editor type of software package so that various annotations could be added to the image before pasting the annotated image into a word-processor file in order to generate a report, or to be saved as part of an electronic lab notebook or other historical record.

One attempt at allowing a user to return an oscilloscope to a prior state was the LeCroy LS-140 oscilloscope. In a snapshot mode, acquisition data is stored to a storage device, and returned to channel acquisition memory as desired. The oscilloscope would therefore be in the same state as when it acquired the data. However, no graphical data is stored. Rather, any graphics is regenerated based upon the returned acquisition data.

SUMMARY OF THE INVENTION

In accordance with the invention, an electronic reporting function, along with an electronic annotation feature comprising the invention take advantage of the fact that most modem DSOs are now equipped with touch-screens, storage memory, and various other data entry and management functions. Instead of transferring a stored data image out of an oscilloscope to a host computer and thereafter annotating the image in a picture editor type software package, in accordance with the invention, a report including various information desired about an image is first generated. This report, may be annotated directly on the touch screen of the oscilloscope, as activated by a user's finger, or preferably a stylus. Such an annotated report may be stored for output in various formats. Additionally, the report and associated stored data may be used to return the oscilloscope to the precise state it was in when the report was first generated, thus allowing in the future for additional measurements or the like to be performed as if the oscilloscope were in the same, earlier state.

In accordance with the invention, a user first determines an image that is to be part of a report. This image not only includes a displayed number of waveforms, but also may include various value indicators, trigger indicators and other display configuration settings, such as values and time per division, various time bases and trigger characteristics. Upon a request to save the image as a report, all of the image data and operating configuration settings of the oscilloscope in place during generation of the image are stored, along with the actual data currently stored in the channel acquisition input buffers. This report information can then be printed, viewed in an external viewer, emailed, stored to a particular storage location, and exported to any of a number of formats. The report may also be annotated before any of these processes for storing the report are performed.

Further, in accordance with the invention, an annotation of a report is intended to include free-form annotations, and also shapes, arrows, text, etc. Handwriting recognition is also preferably used to transform handwritten notes into more readable, computer recognizable text. Once annotated, the report can be printed, emailed, stored, or transferred into any form of documentation. Optionally and preferably, the annotation is stored electronically separately from the image, in either vector, or raster form, allowing the raw, un-annotated image, to be extracted if desired.

Because all of the actual acquisition data has been stored along with the report, at any desired time a user may return the oscilloscope to the precise state it was in when the report was generated. Thus, the captured acquisition data can be reloaded into the acquisition channel buffer memory so that the oscilloscope will appear as if it had just acquired the data. This is very helpful if, for example, after reviewing a report, a user wishes for additional measurements to be performed on the data. If the memory had been cleared, without the present invention, these measurements might be unavailable to the user.

The invention accordingly comprises the several steps and the relation of one or more of such steps with respect to each of the others, and the apparatus embodying features of construction, combinations of elements, and arrangements of parts that are adapted to effect such steps, all as exemplified in the following detailed disclosure, and the scope of the invention will be indicated therein.

BRIEF DESCRIPTION OF THE DRAWINGS

For a more complete understanding of the invention, reference is made to the following description and accompanying drawings, in which:

FIG. 3 is a depiction of a standard report in accordance with the invention;

DETAILED DESCRIPTION OF THE PREFERRED EMBODIMENTS

Figure 1:
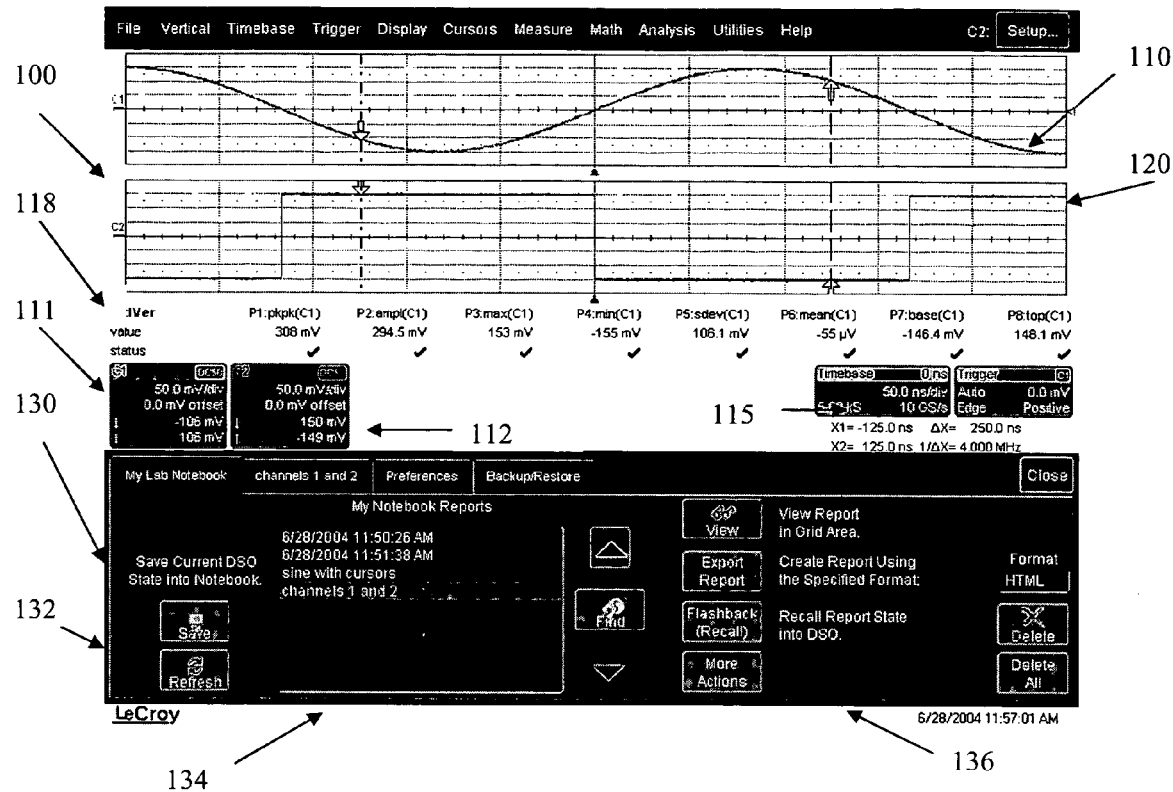
FIG. 1 is a screen capture of an oscilloscope display in which a report generation feature in accordance with the invention has been initiated.

Referring next to the drawings, preferred embodiments of the invention will now be described. FIG. 1 depicts a screen capture of an oscilloscope display in which a report generation function in accordance with the invention has been initiated.

As is show in the upper portion of the screen capture labeled 100, captured or processed waveforms 110, 120 respectively associated with two input channels (C1, C2) are shown. Also included are various display configuration settings 111, 112, respectively associated with the waveforms displayed with the first and second acquisition channels. Shown at 115 are various time base, trigger, and other information related to the acquisition and display of the waveforms and other associated data. Readings of values at predetermined times, or other automated measurements made on one or more of the captured waveforms are shown at 118. These reading of course may be predefined to designate any reading or value desired by a user.

As is further show in FIG. 1, a report generation portion 130 is shown. This top level menu provides features that allow a user to save a report, to refresh a list of reports, or to flashback the oscilloscope and display to the current settings and current display (100) at a later time, once these settings are stored in a report. A screen portion 134 displaying all of the currently saved reports, and an action section 136 allowing a user to perform various functions on a selected stored report are also provided. These functions include viewing a selected report on the grid display area of the oscilloscope, creating a report to be output using a pre-selected output format, or flashing the oscilloscope back to the status when the report was generated, so that all of the data associated with the selected report is reloaded back into the acquisition memory, effectively placing the oscilloscope in the precise state as when the report was initially generated and stored. As noted above, this allows for additional measurements, and any other desired data, to be obtained. Selected reports and various other functions are also provided on tab selectors, and will be further described below. Thus, it is not merely the display that is flashed back. Rather it is the entire internal acquisition and memory storage that is refreshed, thus allowing for new measurements on the previously acquired data.

In addition to storing acquired waveforms, in a preferred embodiment of the invention, a user is able to store computed or processed waveforms. This invention is especially helpful when a user desires to store a computed or processed waveform that has employed multiple previously acquired waveforms in its generation. For example, an average waveform that shows an average of a previously selected number of acquired waveform may also be stored in a notebook entry, thus allowing a user to flashback the system to view the average waveform, even if the underlying acquired waveforms used to generate the average waveform are not stored. Of course, the user could also store the underlying waveforms as well, thus allowing a user to continue generation of the average waveform at the precise location at which the generation had previously been stopped. Thus, if the underlying data is also stored, the user may continue to acquire data and generate the calculated waveforms immediately, from the precise point at which the calculation was previously stopped, thus allowing a user to continue operation of the oscilloscope as if it had never been shut down or had the data removed from the oscilloscope.

Along the same lines, in addition to waveforms, various other determined or generated values may be stored. These may include persistence maps, parameter values that have been calculated in accordance with a cumulative calculation, histograms, etc., and any other value or values that may be calculated and displayed on an oscilloscope.

Therefore, even though the underlying data values are not stored, upon a flashback of the system, the user could view the stored results. As noted above, if the underlying data is also stored, the user could continue to acquire data and calculate the determined or generated values immediately, from the precise point at which the calculation was previously stopped, thus allowing a user to continue operation of the oscilloscope as if it had never been shut down or had the data removed from the oscilloscope.

Figure 2:
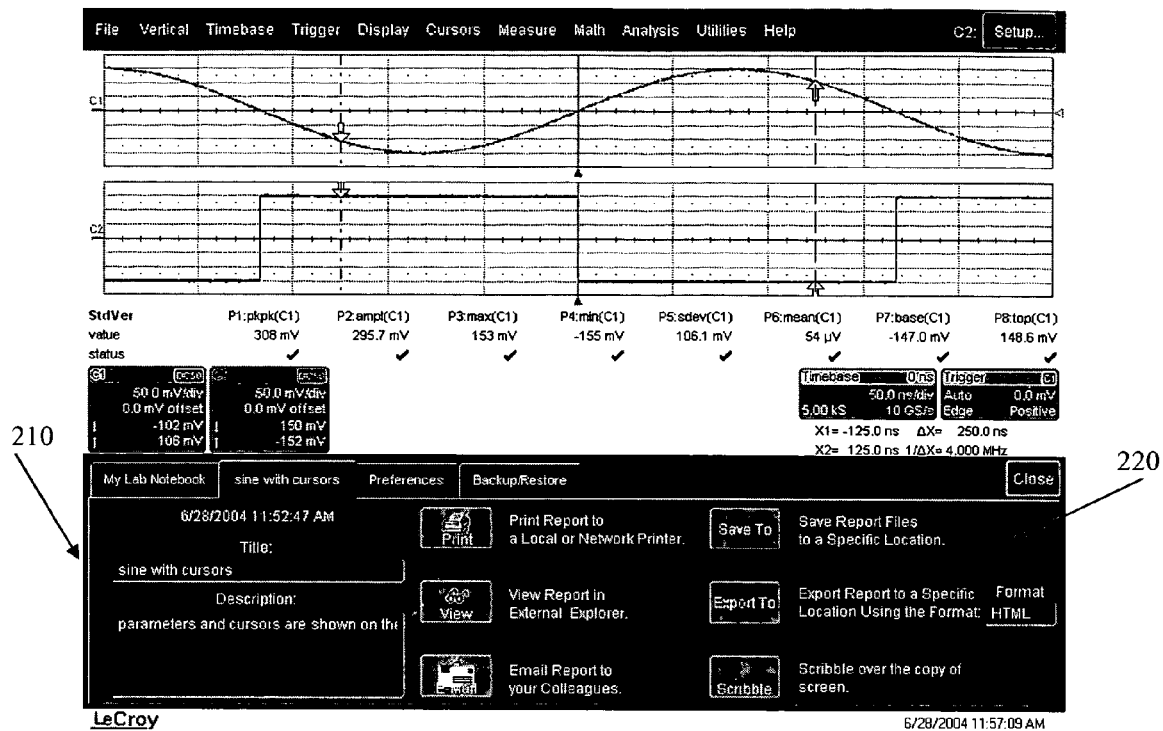
FIG. 2 is a screen capture of an oscilloscope display in which a stored report has been selected in accordance with the invention.

Referring next to FIG. 2, once a user selects a particular stored report from the selection menu, the report is opened, stored data is reloaded into the oscilloscope, and a user is provided with additional choices applicable directly to the individual selected report. Alternatively, a user reaches the same screen if the save button in section 132 is selected in FIG. 1, and the report is stored for the first time. In addition to being provided with the waveform display of FIG. 1, a user is also provided with a title and description portion 210 allowing the naming and description of the report file. A date and time are also provided and stored along with the other identifying information for the stored report.

Once the report has been opened (or stored for the first time) the user is presented with a number of options in menu portion 220 directly related to the manipulation and processing of the current report. These choices allow a user to print the report (the user will be able to print multiple "pages") to a local or other desired network printer, view the report in an external viewer such as Windows Explorer, email the report optionally with the saved data and panel setup, save the report files to a specific location (either to memory on the oscilloscope, or to some external storage location) still in the report format used by the oscilloscope, or export the report to a particular location in a predefined format different from the internal format of the oscilloscope. An annotation feature in accordance with the invention may also be used to annotate the report before performing the other functions.

If the user wishes to print the report, a predefined template is selected, and the report information is provided to populate the template. Thus, a user is provided with a standard report of information that can be used for various purposes. An example of such a report is shown in FIG. 3. A user is presented with various information about the stored report that was previously stored in the system by the user. A screen capture of the image of the waveforms, and other information such as that described in FIG. 1, may also be stored with the report (but is not shown in this report). Finally, various channel and acquisition status information is provided to a user.

Figure 4:
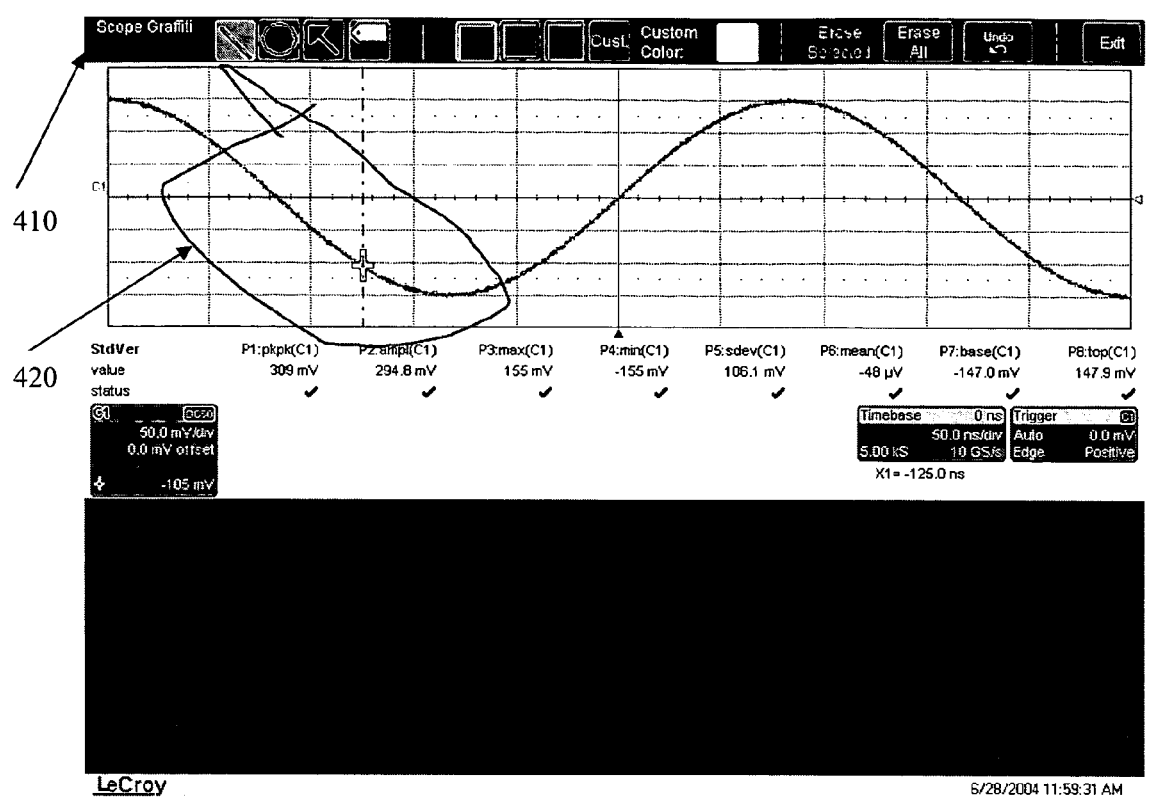
FIG. 4 is a screen capture of an oscilloscope display in which an annotation feature of the invention is shown.
Figure 5:
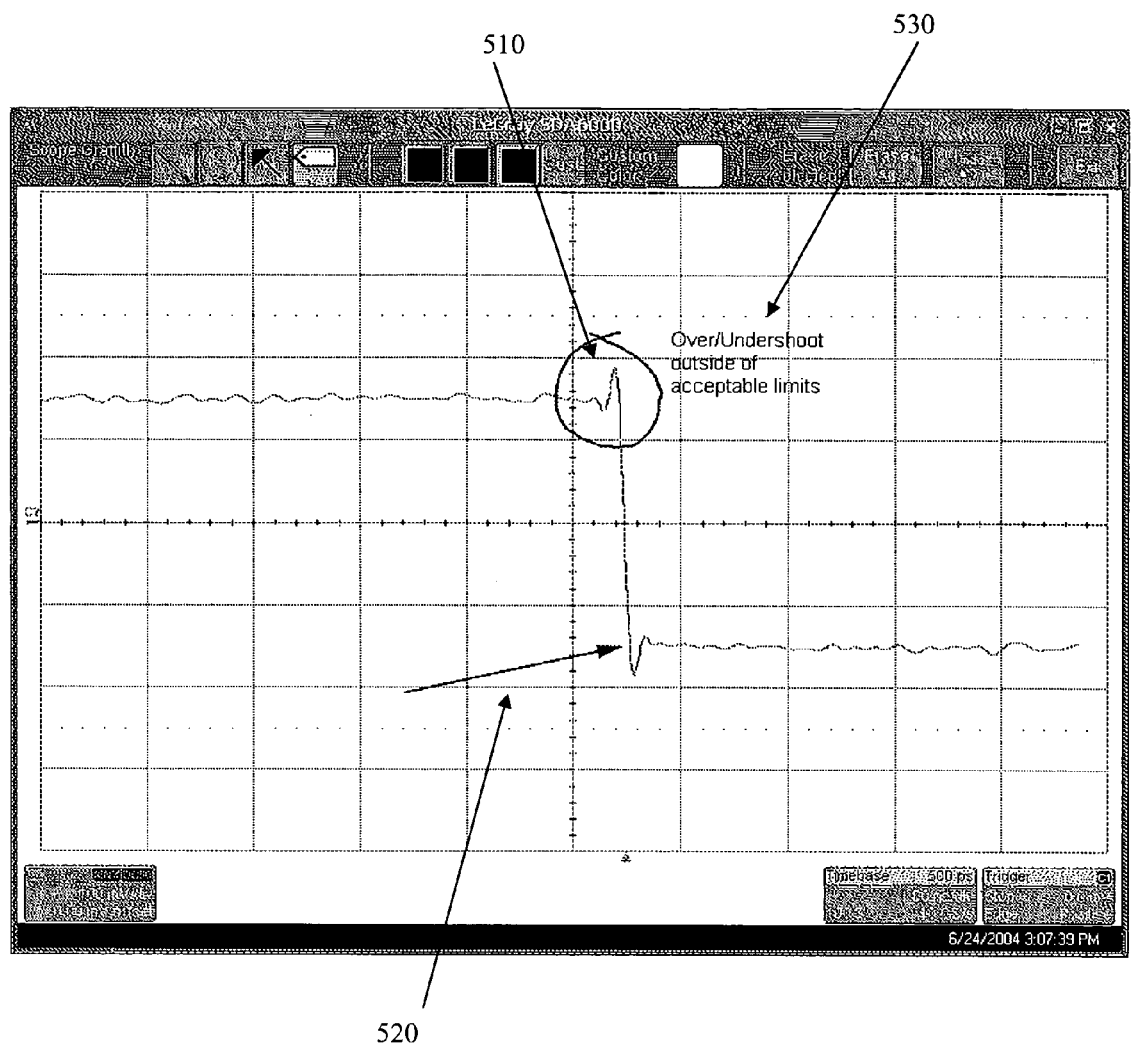
FIG. 5 is another screen capture of an oscilloscope display in which the annotation feature of the invention is shown.

Referring back to FIG. 2, while many of the selections in FIG. 2 are self explanatory (view, email, save and export), if a user selects Scribble, or other annotation designation choice, as provided, the user is given the opportunity to annotate report information shown on the screen. FIG. 4 depicts an annotated display image showing an example of freehand annotation in which a user has drawn a circle 420 on the screen in accordance with the invention. As shown in FIG. 4, in addition to merely writing freehand on the display, a user is provided with a menu 410 for annotating the image using various additional indicators (circle, arrow, tag), selecting one or more desired colors, and erasing a selected or all of the annotated information. FIG. 5 shows an annotated image including freehand drawing 510, an arrow 520, and text 530 placed on the image that has either been entered in as text, or written in by hand and then electronically converted to text.

As is noted above, oscilloscopes typically include a touch screen (or other input device, such as a PDA, touchpad, trackball, or similar device), and therefore screen data entered by a user to annotate the system is recognized and captured in a known manner. Additionally, the methods for converting written information to text in computer format are also known. Therefore, the features of the annotation element of the invention may be implemented using standard hardware and software elements combined with various oscilloscope components in a new, novel and extremely useful tool. Once annotated, a user is forwarded back to the screen shown in FIG. 2, and the report information is stored once again, being updated by the annotated information. This annotated information is then available with the remainder of the report information for printing, emailing, etc., just as the report was before the annotations were made. Optionally and preferably, the annotation is stored separately from the image, in either vector, or raster form, allowing the raw, un-annotated image, to be extracted if desired. Of course, the annotation may also be stored as part of the image, if desired.

Figure 6:
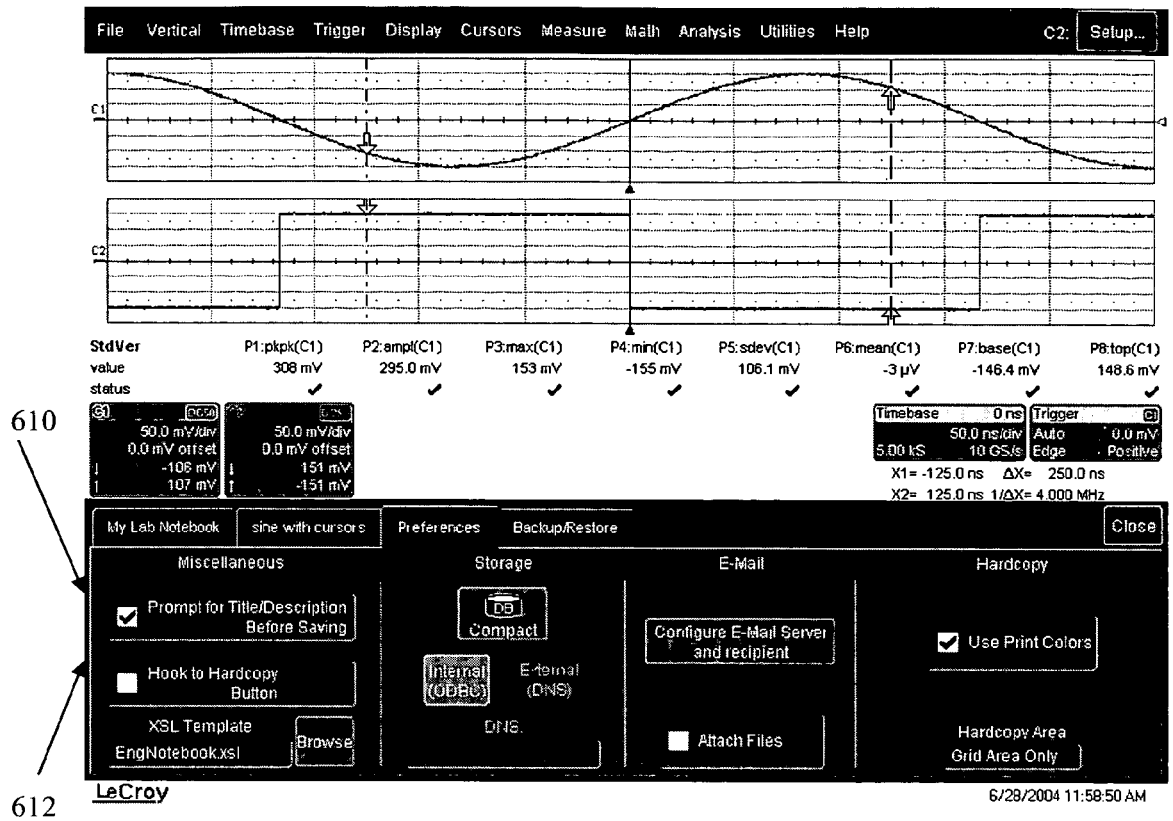
FIG. 6 is a screen capture of an oscilloscope display in which various functions available upon generation of a report are shown.

Referring once again to FIG. 2, if a user selects the tab marked "Preferences", a screen such as that shown in FIG. 6 is shown in which the preferences for the various functions may be designated. Thus, while the display of the acquired waveform and associated data as in FIG. 1 is still displayed, a user is provided with a preferences menu 610.

In a menu section 612, a user can request that a title and description be prompted for when the save button is selected in FIG. 2. If not, the report may simply be saved by date and time, if the user does not enter a title and/or description on their own. A user may also select to relate the saving of a report to a button on the oscilloscope that prints out a hardcopy of the screen image at any time. Thus, upon selecting to print a hardcopy of a screen image, a save operation will be initiated to store the report as described above without having to display the dialog (130) shown in FIG. 1. A user is also able to designate a particular template that is to be used for storing, exporting and reproducing the reports. One of a plurality of predefined templates may be selected, or a user may define and save a personalized template thus allowing him to customize the report format and/or include his company information. Because the stored data is stored in a database format, various output and display templates may be provided or defined. In addition to the application of templates by a user, the user is able to designate an external program to gain access to the report generation and storage API, and control the report generation and storage program, instructing what information is to be stored, and how it is to be displayed. Thus, for example, if a user is to perform a test in accordance with a USB2 testing procedure, and external USB2 report and testing program may instruct the report generation and storage software of the invention as to which information is to be saved, and how it is to be output. Furthermore, once data is stored in a report database in accordance with the invention, in any format desired by a user, an external software program may be employed to access some or all of this information for data mining, statistical analyses, archiving, or the implementation of an automated printing or other automated processing. In this manner, the report generation and storage may be controlled by a user, or by an external automated process or software program, thereby easily being configurable to obtain any type of desired information. The report information may also be stored to a storage device in a more traditional directory structure.

In the preferences tab, the user is also able to define various functions to be performed for compressing the storage database, configuring email, and defining the screen to be properly set up for delivering a hardcopy of the report. By default, the pages of the report are preferably stored in a local database. This local database is preferably organized by notebooks, one notebook being assigned for each project or user. In this manner, each user (there can be multiple users if the instrument is shared) can store multiple reports for one or more projects in an organized and intuitive manner. Alternately, the user can choose to use a central, networked database in order to log the data in a common place with other instruments, or as noted above, store to a storage device in a more traditional directory structure.

Figure 7:
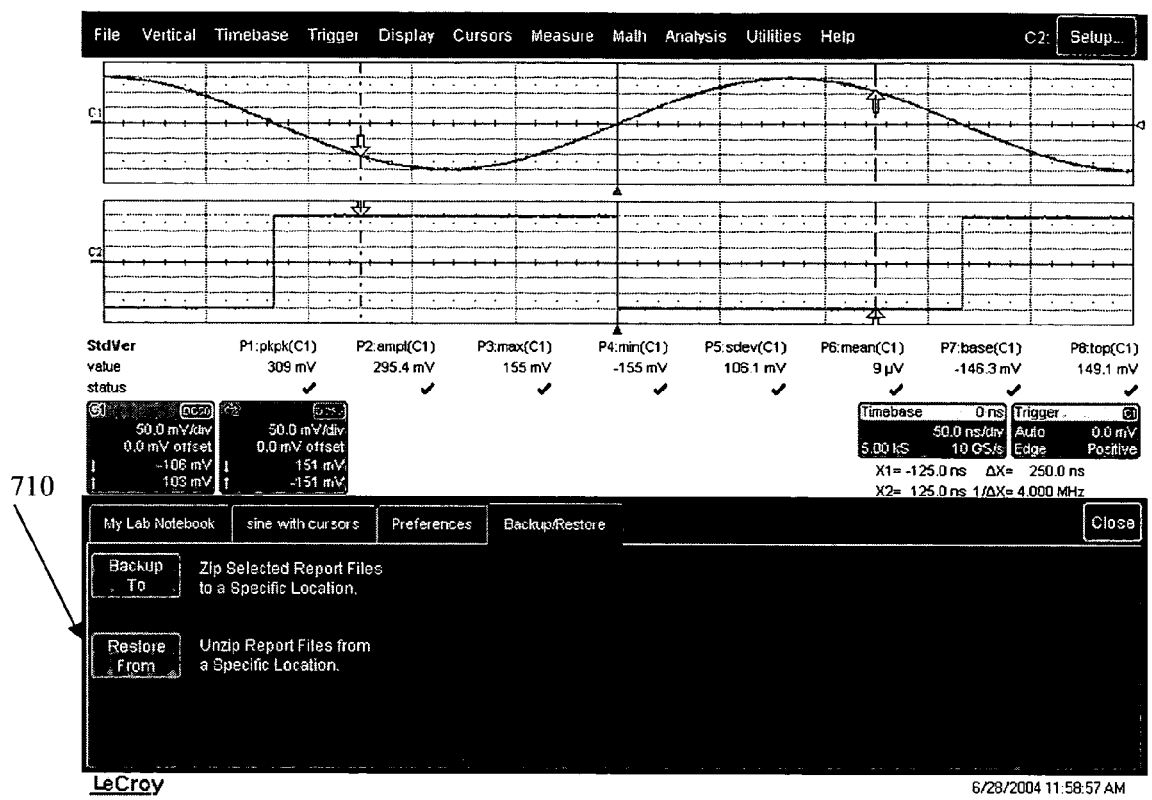
FIG. 7 is a screen capture of an oscilloscope display in which features including backup and restoration of a report are shown.

Finally, if in FIG. 2 a user selects the "Backup/Restore" tab, a screen such as that shown in FIG. 7 is displayed. A user is provided with a Backup/Restore menu 710. This allows a user to backup the stored report files in a chosen format (such as .zip) to a remote or local storage location, and restore report files from similar locations.

Figure 8:
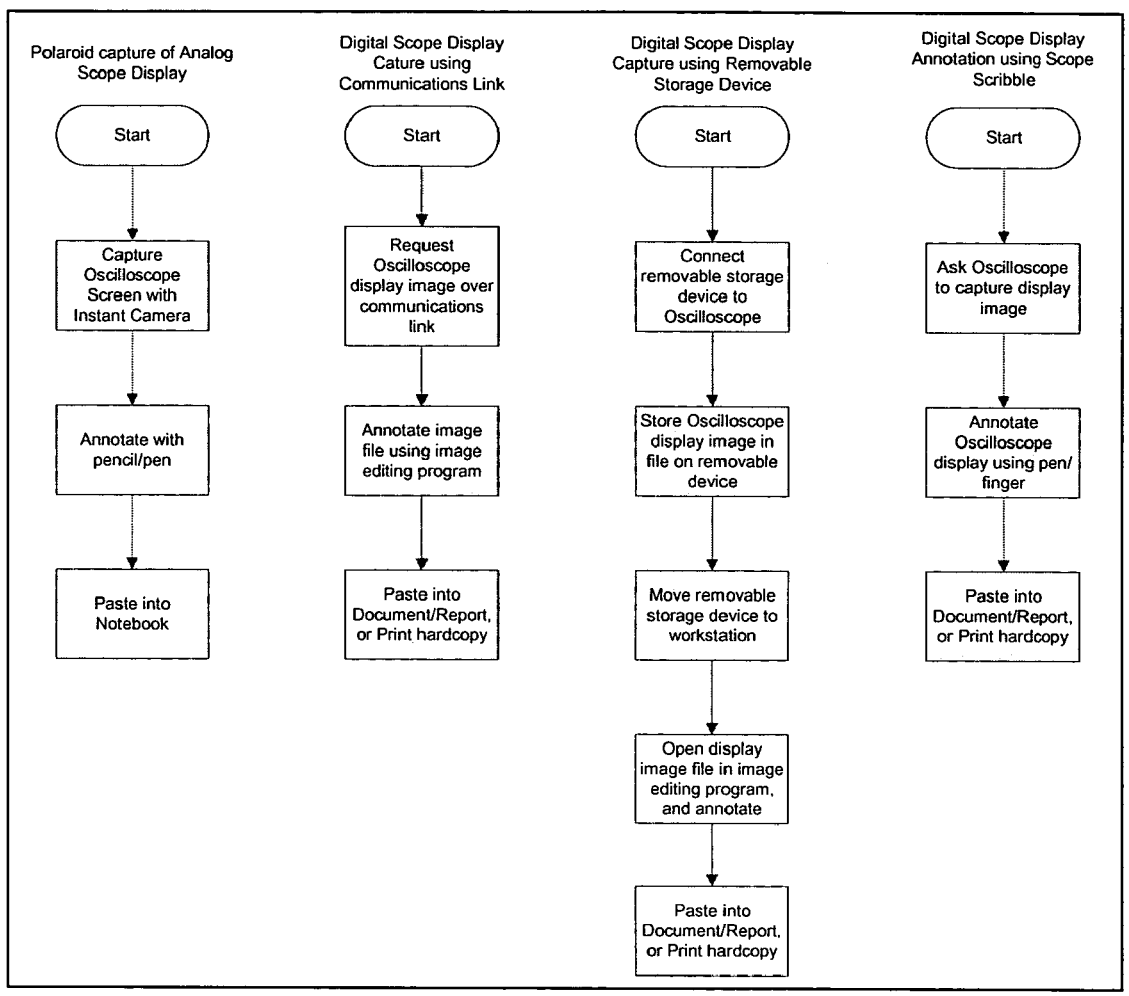
FIG. 8 is a diagram depicting a comparison of various workflows for the process of the invention as compared with various other processes.

Therefore, in accordance with the invention, the user is provided with a streamlined method for document generation and for reporting work performed. Various workflows comparing the prior art methods noted above and the method in accordance with the invention (shown at the far right) are shown in FIG. 8. These include the instant camera method, the communication link method, and the removable storage device method noted above in the Background of the Invention. As is shown, the method in accordance with the invention allows for the storage of the report, even if annotation of the report is desired, in a relatively short number of steps. The report is comprehensive, and easy to store, and share with others. Furthermore, because the actual channel and other acquired or generated data is stored, the data that was in the oscilloscope, and therefore used to generate the report may be loaded back into the oscilloscope, thus making measurements repeatable at disconnected points in time. A user is therefore able to revisit their work at a later time without having to reacquire input data. In many cases, that input data may not be otherwise available. Additionally, the report may be loaded into memory on another oscilloscope having similar properties to the oscilloscope on which the report was generated, thus placing the other oscilloscope in a state similar to the state the first oscilloscope was in when it generated the report.

While the invention has been generally described as a set of method steps to be performed by an apparatus, it should be understood that this description is intended to be equally implemented by computer software running on a dedicated oscilloscope, or other general purpose computing system. The invention also is intended to describe a hardware system, including an acquisition system for acquiring input data, a display for displaying information, a memory for storing various information, and one or more controllers for controlling operation of the device and memory.

It will thus be seen that the objects of the invention made apparent from the preceding description, are efficiently attained and, because certain changes may be made in carrying out the above method and in the constructions set forth without departing from the spirit and scope of the invention, it is intended that all matter contained in the above description and shown in the accompanying drawings shall be interpreted as illustrative and not in a limiting sense.

It is also to be understood that the following claims are intended to cover all of the generic and specific features of the invention herein described and all statements of the scope of the invention which, as a matter of language, might be said to fall therebetween.

What is claimed:

1. A method for storing information in an oscilloscope, comprising the steps of:
    storing a screen display in a predetermined format, the screen display comprising image data and at least one of an annotated image and a notation to a waveform image displayed on a display;
    storing one or more oscilloscope configuration settings associated with the screen display; and
    storing data acquired by the oscilloscope via one or more input channels to one or more channel acquisition input buffers associated with the stored screen display; and
    loading the stored screen display, the one or more associated configuration settings into the oscilloscope, and the stored data acquired by the oscilloscope into the one or more channel acquisition input buffers, thereby placing the oscilloscope in the state it was in when stored data was originally generated.

2. The method of claim 1, wherein a user is able to take further measurements based upon the loaded data acquired by the oscilloscope and loaded into the one or more channel acquisition input buffers as if the oscilloscope had been retained in a state as if the data acquired by the oscilloscope and stored to the one or more channel acquisition input buffers had not been removed.

3. The method of claim 1, wherein the stored screen display, the one or more associated configuration settings, and the stored data acquired by the oscilloscope and stored to the one or more channel acquisition input buffers may be loaded into a second oscilloscope having similar properties to the oscilloscope on which the screen display, configuration settings and data acquired and stored to the one or more channel acquisition input buffers was stored, thereby placing the second oscilloscope in a state similar to the state the original oscilloscope was in when the stored data was originally acquired and generated.

4. The method of claim 1, wherein the stored screen display, the one or more associated configuration settings, and the stored data acquired by the oscilloscope and stored to the one or more channel acquisition buffers may be loaded into a multipurpose, or other dedicated computer for further analysis.

5. The method of claim 4, wherein the further analysis comprises performing at least additional measurements on the stored information.

6. The method of claim 1, wherein the stored screen display, configuration settings and data acquired by the oscilloscope and stored into the one or more channel acquisition input buffers are maintained as a single entry to a multiple entry database.

7. The method of claim 6, wherein each single entry of a multiple entry database comprises an individual report.

8. The method of claim 7, wherein a report of any predefined format can be generated from the data comprising a stored individual report.

9. The method of claim 8, wherein the report of the predefined format may be further customized in accordance with a user instruction.

10. The method of claim 9, wherein the user instruction comprises indicating a predefined user template to he used to format the data of the report.

11. The method of claim 7, wherein one or more individual reports comprise a notebook.

12. The method of claim 11, where a user may maintain a plurality of notebooks.

13. The method of claim 11, where each of a plurality of users on a single oscilloscope maintains one or more notebooks.

14. The method of claim 6, wherein the multiple entry database is maintained on a centralized computing platform.

15. The method of claim 14, wherein the multiple entry database can be accessed by another networked computer for performing further analysis on the information stored in the multiple entry database.

16. The method of claim 1, further comprising the step of storing one or more measured parameters associated with the screen display.

17. A method for storing information in an oscilloscope, comprising the steps of:
    storing a screen display in a predetermined format, the screen display comprising image data and at least one of an annotated image and a notation to a waveform image displayed on a display;
    storing one or more oscilloscope configuration settings associated with the screen display;
    storing data acquired by the oscilloscope via one or more input channels to one or more channel acquisition input buffers used to generate the screen display;
    loading the stored screen display, the one or more associated configuration settings into the oscilloscope, and the stored data acquired by the oscilloscope via one or more input channels into the the one or more channel acquisition input buffers, thereby placing the oscilloscope in the state it was in when stored data was originally generated; and
    annotating the restored data.

18. The method of claim 17, wherein the annotating information comprises freehand notations.

19. The method of claim 17, wherein the annotating information comprises computerized text generated from freehand notations.

20. The method of claim 17, wherein the annotating information comprises computerized text entered via a keyboard, or other text entry device.

21. The method of claim 17, wherein the annotating information comprises an object selected from a menu of objects.

22. The method of claim 17, wherein the annotating information is stored as part of the screen display.

23. The method of claim 17, wherein the annotating information is stored apart from the screen display.

24. The method of claim 17, wherein the screen display, configuration settings, data, and annotating information are stored as a single report.

25. An oscilloscope for acquiring and storing information, comprising:

an acquisition system for acquiring input data via one or more input channels; and a memory for storing a screen display in a predetermined format, the screen display comprising image data and one of an annotated image and a notation to a waveform image displayed on a display, for storing one or more oscilloscope configuration settings associated with the screen display, and for storing data acquired by the oscilloscope via the one or more input channels to one or more channel acquisition buffers associated with the stored screen display; and a controller for loading the stored screen display into an oscilloscope display, the one or more associated configuration settings into the oscilloscope, and the stored data acquired by the oscilloscope into the one or more channel acquisition input buffers, thereby placing the oscilloscope in the state it was in when stored data was originally generated as if the oscilloscope had been retained in a state when it acquired such data.

26. The oscilloscope of claim 25, further comprising the step of storing one or more measured parameters associated with the screen display.

27. An oscilloscope for acquiring and storing information, comprising:

an acquisition system for acquiring input data via one or more acquisition channels;

a memory for storing a screen display in a predetermined format, the screen display comprising image data and at least one of an annotated image and a notation to a waveform image displayed on a display, for storing one or more oscilloscope configuration settings associated with the screen display, and for storing data acquired by the oscilloscope via the one or more input channels to one or more channel acquisition buffers used to generate the screen display; and a controller for loading the stored screen display into an oscilloscope display, the one or more associated configuration settings into the oscilloscope, and the stored data acquired by the oscilloscope into the one or more channel acquisition input buffers, thereby placing the oscilloscope in the state it was in when stored data was originally generated as if the oscilloscope had been retained in a state when it acquired such data, and for annotating the restored data.

28. The oscilloscope of claim 27, wherein the annotating information is stored as part of the screen display.

29. The oscilloscope of claim 27, wherein the annotating information is stored apart from the screen display.

\* \* \* \* \*